US005710395A

United States Patent [19]

Wilke

[11] Patent Number: 5,710,395

[45] Date of Patent: Jan. 20, 1998

[54] HELMHOLTZ RESONATOR LOUDSPEAKER

[76] Inventor: Paul Wilke, Eroicagasse 13, 1190 Vienna, Austria

[21] Appl. No.: 411,229

[22] Filed: Mar. 28, 1995

[51] Int. Cl.$^{6}$ .......... H05K 5/00

[52] U.S. Cl. .......... 181/153; 181/156; 181/160; 181/199

[58] Field of Search .......... 181/148, 152, 181/153, 156, 199, 151, 160; 381/159, 158, 205

[56] References Cited

U.S. PATENT DOCUMENTS

| | | | |
|---|---|---|---|
| 2,129,184 | 9/1938 | Roy . | |
| 2,975,852 | 3/1961 | Chave . | |
| 3,135,348 | 6/1964 | Bill | 181/153 |
| 3,371,742 | 3/1968 | Norton et al. . | |
| 3,638,753 | 2/1972 | Cunningham . | |
| 3,818,138 | 6/1974 | Sperrazza, Jr. . | |
| 3,819,005 | 6/1974 | Westlund . | |
| 3,978,941 | 9/1976 | Siebert . | |
| 4,169,516 | 10/1979 | Honda | 181/153 |
| 4,223,760 | 9/1980 | LeTourneau . | |
| 4,281,738 | 8/1981 | Jackson . | |
| 4,592,444 | 6/1986 | Perrigo . | |
| 4,819,761 | 4/1989 | Dick . | |
| 4,865,153 | 9/1989 | Toyoda . | |
| 4,953,655 | 9/1990 | Furukawa . | |
| 4,964,482 | 10/1990 | Meyer . | |
| 5,012,890 | 5/1991 | Nagi et al. . | |
| 5,025,885 | 6/1991 | Froeschle | 181/156 |
| 5,227,591 | 7/1993 | Tarkkonen . | |
| 5,268,538 | 12/1993 | Queen . | |
| 5,306,880 | 4/1994 | Coziar et al. . | |
| 5,359,664 | 10/1994 | Steuben . | |
| 5,402,502 | 3/1995 | Boothroyd et al. | 181/153 X |
| 5,552,569 | 9/1996 | Sapkowski | 181/199 |

FOREIGN PATENT DOCUMENTS

| | | |
|---|---|---|
| 864683 | 4/1961 | United Kingdom . |

*Primary Examiner*—Khanh Dang

*Attorney, Agent, or Firm*—Karen Lee Orzechowski; Nath & Associates

[57] ABSTRACT

A Helmholtz resonator loudspeaker having a capsule shape that may be truncated at one or both ends. When the housing is truncated, dampening material may be added at the truncated portion. Legs or a stand aid in the physical stability and to further assist the acoustics. The resonator tube is located on the interior of the housing chamber with one end opening into the interior concentric with an axis running along the length of the capsule and the other end exiting the housing below the speaker.

5 Claims, 2 Drawing Sheets

HELMHOLTZ RESONATOR LOUDSPEAKER

FIELD OF THE INVENTION

The present invention is generally directed to loudspeakers, and more particularly to loudspeakers of the Helmholtz resonator type. More specifically, the present invention is directed to a very efficient Helmholtz resonator loudspeaker having a novel shape that allows for a compact, lightweight design while reducing standing waves and improving acoustical properties.

BACKGROUND OF THE INVENTION

Loudspeakers are used to reproduce sound recorded in different media. The most widely used type of loudspeaker is the dynamic loudspeaker in which an electrical coil of wire is suspended in a fixed magnetic field provided by a permanent magnet. Sound currents (i.e., the electrical impulses into which sound waves have been transformed) flow through the coil. These currents produce a magnetic field that interacts with the fixed magnetic field, causing the coil to move. A cone-shaped diaphragm fastened to the coil alternately pushes and pulls the air in front of it, creating sound waves. Dynamic speakers are normally mounted in an enclosure or against a large baffle to prevent the air compressed by the front surface of the diaphragm from simply circulating around the edge of the speaker to fill the rarefaction created at the back surface, thus neutralizing the acoustic output. This is a particular problem at the low frequencies, where the cone moves back and forth relatively slowly. In order to improve reproduction of such low frequencies, the front of the speaker has to be separated acoustically from the front.

The performance of a dynamic loudspeaker depends heavily on the kind of enclosure in which it is mounted. One solution to this problem has been to use an acoustic suspension speaker system in which the front and rear of the speaker are completely separated. The resulting enclosed volume of air, rather than a conventional mechanical suspension, supplies much of the restoring force to center the cone after its excursions. This type of design is particularly popular in home sound systems because of its relatively small size and smooth bass response. However, the acoustic energy emanating from the rear of the speaker is lost. Another solution is to introduce a bass vent (opening) in the enclosure. This setup is based on the Helmholtz resonator.

A Helmholtz resonator is a closed volume of air communicating with the outside through a pipe. The enclosed air resonates at a specific frequency that depends on the volume of the containing vessel as well as the dimensions of the pipe being used. Helmholtz resonators used for loudspeaker enclosures are usually in the form of a rectangular box with a pipe located in a circular opening whose diameter is typically smaller than that of the loudspeaker. Helmholtz resonators can be thought of as analogous to an object with a certain mass connected to a spring. The air enclosed in the chamber (acting as a kind of cushion) provides the stiffness of the system, thus acting as a spring, and the air enclosed in the pipe acts as a mass. Together, this produces a resonator of a specific frequency. If a speaker is mounted in such a resonator, carefully tuned to its specifications, a straight frequency response into deep bass can be achieved. This is because around the natural frequency of the Helmholtz resonator, the vibrating air exiting from the pipe produces most of the acoustic pressure. At the same time, the excursions of the speaker cone are limited because of back pressure from the inside of the Helmholtz resonator; the phase of the back pressure in the Helmholtz resonator is opposite to that of the speaker. The result is better bass at higher acoustic pressure levels than would be possible otherwise.

From a standpoint of ease of manufacture, most manufacturers have chosen to enclose their loudspeakers in rectangular box shaped enclosures so that there is always a wall spaced from the rear of the loudspeaker and substantially parallel to the plane of the loudspeaker cone. Also, the wall in which the loudspeaker is mounted is generally of large area compared to the area of the loudspeaker itself. Such enclosures tend to distort the radiation sound due primarily to vibrations in the walls of the enclosure, i.e. panel resonance. Efforts to reduce panel resonance have required the use of heavy, acoustically inert materials. Such rigid panels are even more important with enclosures based on a Helmholtz resonator because of the high acoustic pressures generated inside such enclosures.

In the present art, speaker enclosures utilizing Helmholtz resonators come in two forms. The first form, mainly used for stationary purposes, consists of enclosures with at least four flat walls. An example of such an acoustic apparatus utilizing a Helmholtz resonator is shown in U.S. Pat. No. 4,953,655 to Furukawa and assigned to Yamaha Corporation. The Furukawa patent, in an effort to achieve lower bass sound reproduction without noise or distortion components, utilizes a Helmholtz resonator in which the pipe from the resonance port exits into a second chamber that operates as an acoustic filter.

The second form, mainly used in automobile applications, consists of a tube with a speaker mounted at one side, with the axis in the same direction as the tube. These tubes are typically closed at the other side with a flat wall. The pipe can be either in this flat wall, or next to the speaker.

Both these shapes lead to disadvantages with respect to their efficiency as a Helmholtz resonator. The sources of this inefficiency are firstly the occurrence of standing waves between parallel surfaces. Secondly, air in corners does not fully participate in the resonance of the chamber. In large enclosures, this is not much of a problem as this is only a small percentage of the total air mass. However, the smaller the enclosure becomes, the larger this negative effect becomes, even to the extent that very small speakers with straight walls hardly function as Helmholtz resonators at all.

Tubes with a speaker mounted at one side with the axis in the same direction as the tube suffer from a particular disadvantage in that such a construction operates as a quarter wave tube with the speaker in the open end. This maximizes the development of standing waves at the natural resonance frequency of the tube and its harmonics. Therefore, in order to prevent such standing waves, operation is limited to frequencies well below the natural frequency of the quarter wave tube. In the present invention, the speaker can be located at a calculated position on the tube to minimize the occurrence of standing waves. A much broader frequency range can thereby be achieved. Also, by mounting the axis of the speaker at a right angle to the axis of the tube, it becomes much easier to use the speaker in a stationary environment: the tube can be placed in an upright position with the loudspeaker aiming at the listener.

A speaker in the shape of a ball is an optimized shape for a pressure vessel but restricts the length of resonance pipe that may be used and does not have a compact design that lends itself for use in television cabinets and the like.

Attempts have been made to reduce the cost of manufacture of other types of non-Helmholtz resonator speakers while maintaining, or improving, the sound and tonal qualities. Attempts to reduce costs have included the use of a cylindrical speaker housing, such as that shown in U.S. Pat. No. 4,223,760 to LeToruneau, that provides a closed baffle arrangement with some structural rigidity without requiring the use of heavy and massive materials. However, the manner in which the speaker is mounted leads to production disadvantages and introduces diffraction. Physically, as discussed in U.S. Pat. No. 4,819,761 to Dick, an enclosure with a circular wall is inherently more rigid and less subject to variation in volume from dimensional changes due to internal pressure changes caused by excursions of the loudspeaker cone. However, the placement of the speaker at the end of a cylinder, as disclosed in Dick, results in the tube acting as an organ pipe, introducing a basic resonance in the tube and requiring a complex geometry to avoid the formation of standing waves. Furthermore, Dick requires the use of ribs on the inside of the tubes to strengthen the walls, creating additional surfaces that reflect the sound waves thus adversely impaction the sound or tonal quality.

SUMMARY OF THE INVENTION

An object of the present invention is to provide a novel shaped Helmholtz resonator type loudspeaker that is compact, efficiently manufactured, and can be used as a stand alone unit or be readily fitted into existing devices.

Another object of the present invention is to prevent the formation of standing waves and thus improve the tonal quality of the speaker.

Another object of the present invention is to reduce or eliminate panel resonance problems by acoustically canceling out any panel vibrations.

A further object of the present invention is to provide a Helmholtz resonator type loudspeaker in which the stresses are parallel to the direction of the material used, thus allowing for optimal or maximum material strength.

A further object of the present invention is to provide a speaker enclosure with minimized diffraction.

A further object of the present invention is to provide a speaker enclosure with the bass pipe emanating in a location close above the ground in a manner that insures better acoustic coupling with the surrounding air, thus increasing bass response.

A still further object of the present invention is to provide a speaker enclosure fabricated from a thin material without requiring the use of additional sound absorbing material.

These and other objectives of the present invention are achieved by the Helmholtz resonator loudspeaker of the present invention in which the speaker housing or cabinet is a Helmholtz resonator with a novel shape. The speaker housing or cabinet has a capsule shape that may be truncated at one or both ends. When the housing is truncated, dampening material may be added at the truncated portion. Legs or a stand type means may be added at the lower end of the speaker to aid in the physical stability of the speaker in standing and to further assist the acoustics. The resonator tube is located on the interior of the housing chamber with one end opening into the interior concentric with an axis running along the length of the capsule and the other end exiting the housing at a point below the speaker. In one embodiment, the exit port is concentric with the lower end of the capsule. In another embodiment, the exit port is located below the speaker or speakers.

BRIEF DESCRIPTION OF THE DRAWINGS

The invention is further described by way of illustrative examples with reference to the drawings, in which.

It is to be understood that the invention is not limited in its application to the details of construction and arrangement of parts illustrated in the accompanying drawings, since the invention is capable of other embodiments and of being practice or carried out in various ways within the scope of the claims. Also, it is to be understood that the phraseology and terminology employed herein is for the purpose of description and not of limitation.

DETAILED DESCRIPTION OF THE INVENTION

The basic design of the Helmholtz resonator loudspeaker of the present invention is shown in the attached drawing figures in which like part are labeled with the same numerals.

Figure 1:
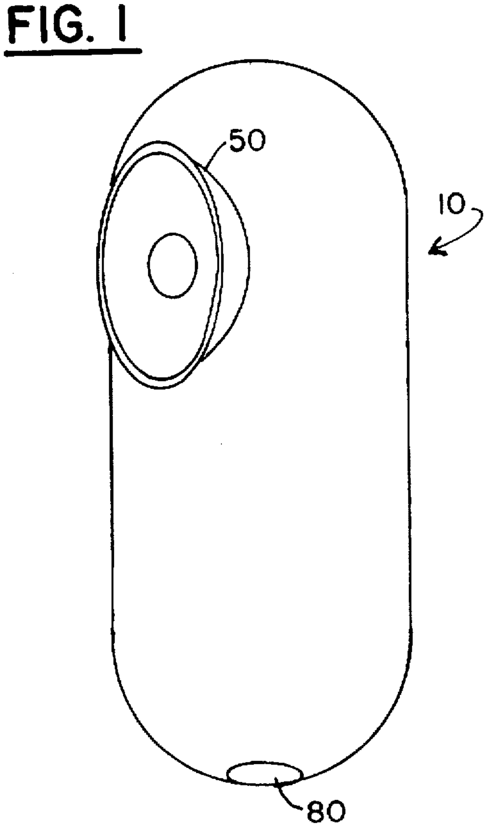
FIG. 1 is a perspective view of one embodiment of the Helmholtz resonator type loudspeaker of the present invention in which the speaker enclosure forming the Helmholtz resonator chamber is capsule shaped and has the resonator port at the bottom of the housing.

FIG. 1 shows a perspective view of one embodiment of the invention in which the speaker housing 10 contains a speaker 50 and a resonator exit port 80 for the resonator duct portion. In the most preferred embodiment of the present invention, as shown more clearly in FIG. 2, the speaker housing 10 has a capsule shape in the form of a symmetrically shaped elongated circular body, the shape of which can be approximated by a length of tube, ending on both sides in a hemisphere. This elongated circular body forms the chamber of a Helmholtz resonator. Specifically, the speaker housing 10 of FIGS. 1 and 2 has a tubular portion 15 and two hemispherical end portions 11 (at the upper end of the speaker) and 12 (at the lower end of the speaker). In other embodiments of the invention, either one end (FIG. 5 and 6) or both ends (FIGS. 7 and 8) of speaker housing 10 may be truncated.

A resonance pipe 70 is located on the interior of the speaker housing 10 and is acoustically coupled to the speaker housing 10 at one end of the resonance pipe 70 to form resonance exit port 80. The other end of the resonance pipe 70 is designated by the numeral 75 and lies on a concentric axis with the tubular walls 15 of the speaker housing 10. The resonance pipe 70 operates to connect the interior chamber 5 of the speaker housing 10 to the outside air through resonance exit port 80. The elongated shape of the Helmholtz resonance chamber 5 of the present invention, together with the location of the resonance pipe 70 and its resonance exit port 80 or 81, allows a longer length resonance pipe 70 to be employed. This is of particular importance in small, high output speakers because it now enables a Helmholtz resonator to be used since a long enough pipe of a large enough diameter can be fitted. In a preferred embodiment of the invention, the resonator pipe 70 exits the Helmholtz resonance chamber 5 through resonance exit port 80, which is located at the bottom of the Helmholtz resonance chamber 5. This location results in a further enhanced bass response amplification. This is because the moving air emanating from the resonance pipe 70 can be characterized by relatively high speed and low volume. By having the resonance pipe 70 exit above the ground, this translates into a larger volume of air moving at a lower speed. Thus, the acoustic coupling with the surrounding air is improved and a higher bass output is achieved.

A speaker 50, having any suitable design but preferably with a total Q of less than 0.7, is mounted by any suitable means so that the axis of the speaker is at right angles with the axis of the tubular portion 15. In one embodiment of the invention, a flange 40 is mounted on or is integrated with the tubular portion 15 of speaker housing 10 and the speaker 50 is attached to the flange 40. More than one speaker may be used, as shown in FIGS. 4 through 8, and described in more detail below.

The novel shape of the Helmholtz resonator of the present invention results in any existing panel vibrations being canceled out acoustically to a large extent. Upon excitation, a cylinder tends to vibrate strongest in an elliptical pattern. This means that opposite sides of the cylinder radiate sound in opposite directions and out of phase. As this sound is radiated in a 360 degree pattern (the vibrating body is out of its piston band) it is effectively canceled out. This allows the walls of the speaker housing 10 to be made of any suitable material including thin, lightweight and relatively flexible materials such as thermoplastics, without the occurrence of panel resonances. In the Helmholtz resonator loudspeaker of the present invention, virtually all stresses are parallel to the direction of the material used, i.e. they run the length of the tubular portion 15 parallel to the axis of the capsule shape. This allows optimum, or maximum, use of material strength to be made. In all speaker enclosures with flat surfaces, the material of the walls has to cope with stretching, compressing and bending forces, and because of these bending forces that the walls have to be made very rigid. In contrast, in the proposed invention, almost no bending forces are created, and thus less rigid, and much thinner materials can be used without adverse effect.

Figure 3:
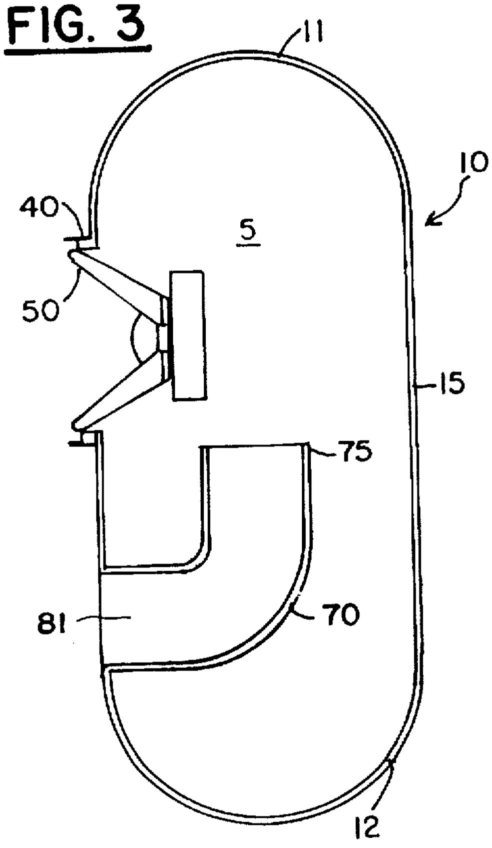
FIG. 3 is a cross-sectional view of another embodiment of the present invention in which the resonator port exits the housing at a location below the speaker.

Another embodiment of the present invention is shown in FIG. 3, where the resonance exit port is designated by the numeral 81 and exits the speaker housing 10 through wall 15 below the speaker 50. This allows the speaker to rest directly on the surface without requiring the use of a legs or stand means that would space the resonance exit port 80 from direct contact with the floor or shelf that the speaker housing 10 is resting upon.

Figure 2:
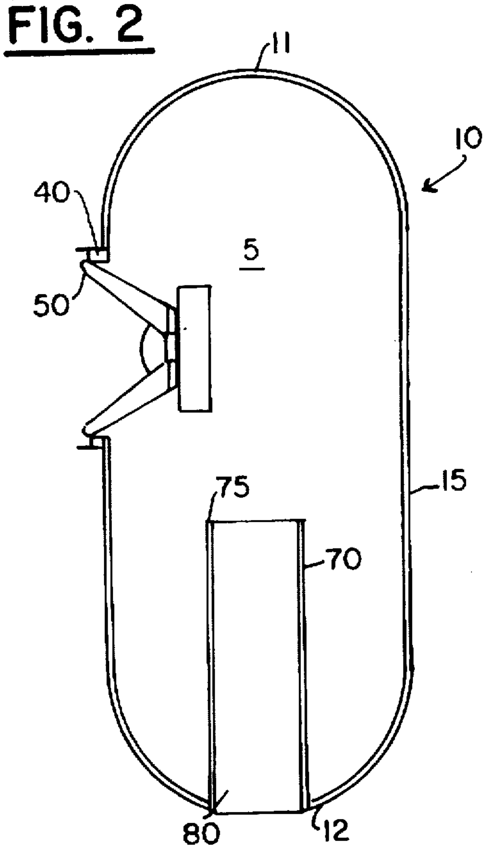
FIG. 2 is a cross-sectional view of the Helmholtz resonator loudspeaker of FIG. 1.
Figure 4:
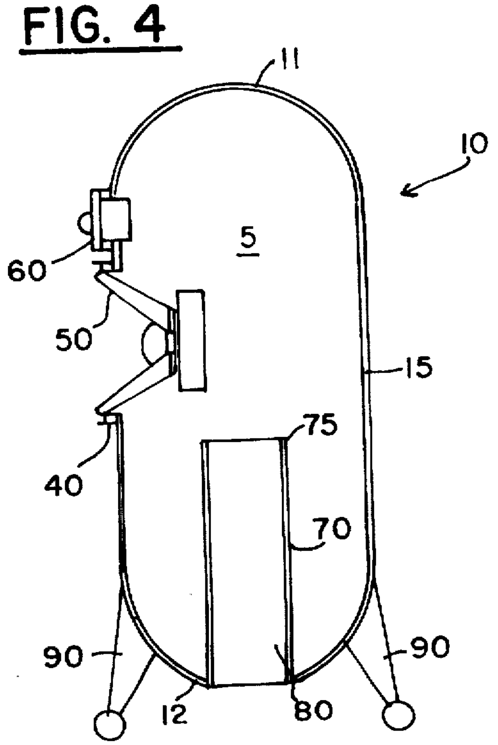
FIG. 4 is a cross-sectional view of another embodiment of the invention depicting two speakers and legs.

The Helmholtz resonator loudspeaker depicted in FIG. 4 is similar to that shown in FIGS. 1 and 2 with the addition of a second speaker 60 and legs 90. As shown in FIGS. 4 through 8, multiple speakers may be used in the speaker housing 10. Furthermore, as shown in FIG. 4 through 8, a leg means 90 (FIG. 4) or 92 (FIGS. 5 and 6) or a stand means 91 (FIGS. 7 and 8) may be utilized to provide stability and assist in standing of a capsule or truncated capsule shaped housing. Such leg or stand means also results in improved acoustics when the resonance exit port 80 is located on the bottom of the speaker housing 10 by allowing the resonance exit port to be spaced and avoid direct contact with the surface the speaker is resting upon. The exit 80 of the resonance pipe 70 slightly above the floor produces very good acoustical coupling between the resonance pipe 70 and the surrounding air. The result is a marked increase in bass output, which becomes most pronounced at lower frequencies.

Figure 5:
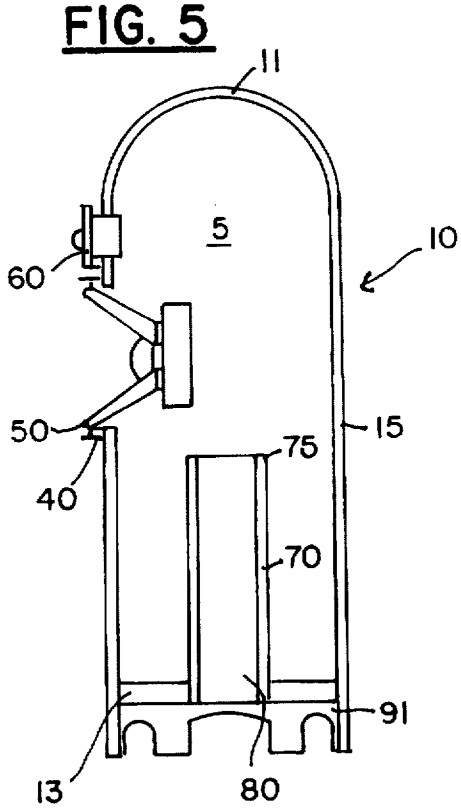
FIG. 5 is a cross-sectional view of another embodiment of the invention in which the Helmholtz resonator chamber has a truncated capsule shape and legs at the lower, truncated portion.
Figure 6:
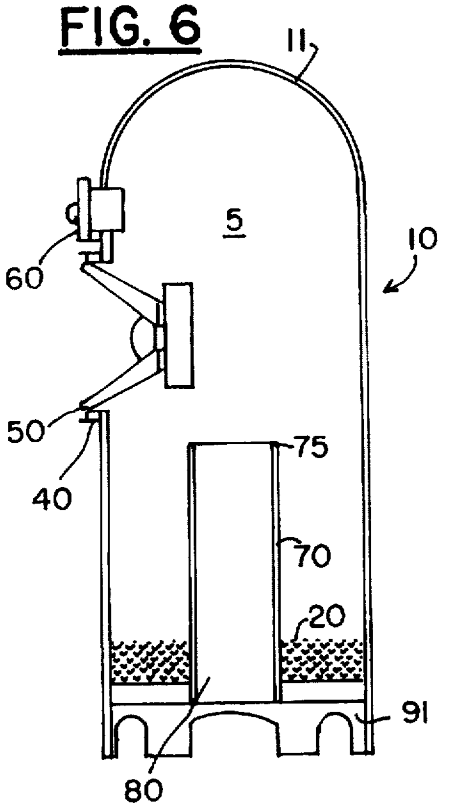
FIG. 6 is a cross-sectional view of a further embodiment of the loudspeaker of FIG. 5 showing dampening material located in the interior at the truncated portion.

As shown in FIGS. 5 and 6, the lower portion 13 of the speaker housing 10 may be truncated. A dampening material 20, as shown in FIG. 6, may be added to improve the acoustical qualities by fighting the harmonics of the resonator frequency. Every resonator tends to resonate not only at its natural frequency Fn, but also at multiples thereof creating what are called harmonics. These harmonics are undesirable in that they adversely affect the sound from the speaker. The higher the Q of a resonator, the stronger these harmonics tend to be. By use of this dampening material, the adverse effects of an efficient resonator with a high Q can be reduced.

Figure 7:
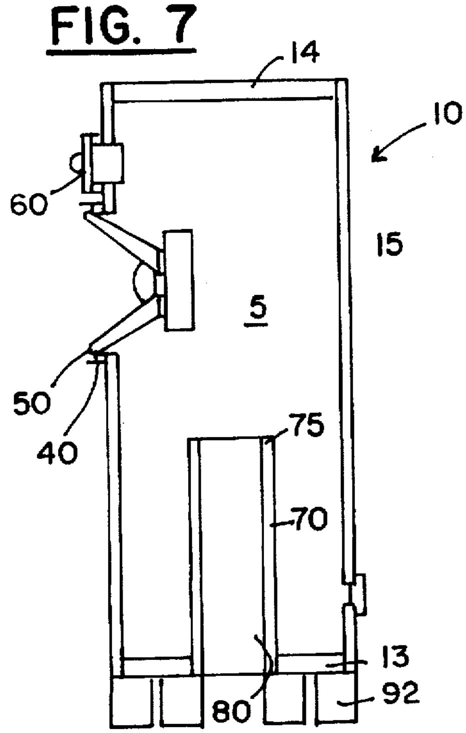
FIG. 7 is a cross-sectional view of another embodiment of the invention in which both ends of the capsule shape are truncated.
Figure 8:
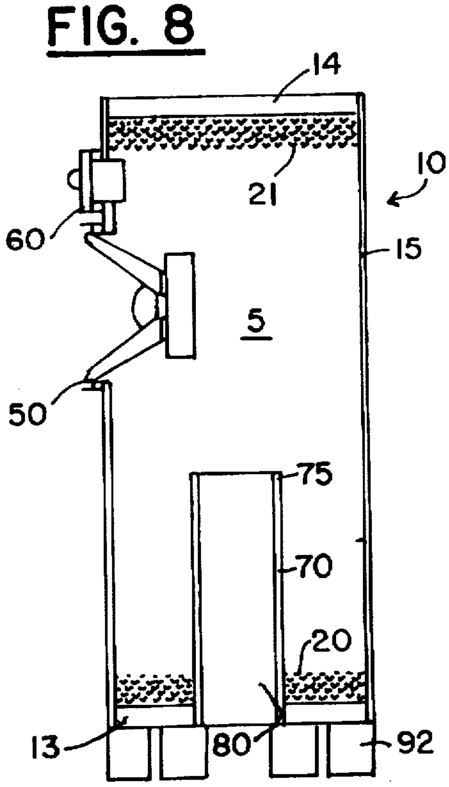
FIG. 8 is a cross-sectional view of a further embodiment of the loudspeaker of FIG. 7 showing dampening material located in the interior at the truncated portions.

In further embodiments depicted in FIGS. 7 and 8, both the lower portion 13 and the upper portion 14 are truncated. As shown in FIG. 8, dampening material 20 and 20 may be added.

The novel shape of the invention produces a very efficient Helmholtz resonator. Because no parallel or flat surfaces exist, standing waves cannot form. Therefore, all acoustic energy that is introduced into the enclosure will be either absorbed, or will be used to generate resonance around the natural frequency of the resonator. As there are virtually no sharp corners, more of the air in the enclosure is taking part in the resonance process. This improved efficiency results in an improvement in bass quantity and quality and the effective filtering out of standing waves in the enclosure.

As more of the acoustical energy in the enclosure will be used to generate bass waves at the desired frequency, a stronger bass is produced than with resonators of a lower Q. Also, the pressure extremes in the resonator will be higher, leading to higher back pressure on the speaker cone, thus limiting cone excursions. This is of particular importance in smaller speaker enclosures. In larger enclosures of this novel shape, the bass amplification effect might become too strong. The speaker housing 10 creates an efficient low frequency resonator and thereby an efficient filter for higher frequencies. This minimizes or obliviates the need for damping materials, although some damping material may be used to fight harmonics of the resonator frequency, as shown in FIGS. 6 and 8.

A Helmholtz resonator operates as an acoustic notch filter. The more efficient a Helmholtz resonator is, the higher the Q, and the better frequencies outside the notch are filtered out. The round shape of the present invention leads to a filter with a high Q. If tuned at an appropriately low frequency, higher frequencies can not develop into standing waves as they will be adequately filtered out. The result is that little or no acoustic dampening material is required in order to achieve an acoustically dead enclosure.

The round shape with speakers mounted sideways and the location of vent pipe have many acoustical and constructional advantages. One advantage resulting from the present invention is a reduction or elimination of the diffraction pattern. The sound produced by any speaker is influenced by its enclosure in subtle ways. All the elements of the speaker enclosure, i.e. the mounting plate, the sides, the back, the corners, operate together to produce a diffraction pattern.

This diffraction pattern aids the ear in locating sounds. Therefore, the more a speaker enclosure diffracts sound, the easier it becomes to precisely locate it. Diffraction also introduces distortions as it acts as an array of discrete notch-filters with each its particular qualities. Diffraction therefore seriously hampers the general sound quality, in particular the stereo image produced if two speakers are being used. The round shape of the invention minimizes diffraction as no sharp corners (or few of them) exist. The result is a dramatic improvement in sound quality.

Another advantage is in the elimination of, or greatly reducing the need for, sound absorbing materials lining the interior of the speaker housing. The walls of speaker enclosures are normally lined with sound absorbing material. This somewhat lessens the reflection of the sound between parallel surfaces, and thereby the development of standing waves. However, such use of sound absorbing materials is eliminated or greatly reduced because of the elimination or reduction of parallel surfaces. Thus, standing waves do not form to the same extent as in enclosures with parallel walls. The result is that only minimal amounts of dampening material, if any, are required in the truncated versions where a limited amount of parallel surfaces are introduced. To dampen the formation of any standing waves, the parallel surfaces have to be lined with sound absorbing material.

Another advantage lies in the reduction of panel resonance, resulting in a cleaner sound. In any properly tuned vented speaker enclosure, high sound pressures exist that make the panels of the enclosure vibrate. The round shape is one of the most efficient ones to contain such pressures. Therefore, with considerably less material than in square boxes, the speaker enclosure suffers from less panel resonance. Additionally, the square panels used by the present art are acoustically well coupled with the air. By virtue of their size, beaming occurs already at relatively low frequencies. Mainly through refraction, this deteriorates overall sound quality. The round panels are much less well acoustically coupled and beaming does not occur at any frequency.

The present invention also results in a significantly more efficient resonator. In any properly tuned vented speaker enclosure, the resonance of the loudspeaker and that of the air in the enclosure cooperate to produce a flat frequency response down into deep bass. The more efficient the resonator is, the greater these gains are. The round shape utilized in the present invention together with the location of the vent pipe produces a much more efficient resonator than other enclosures known in the present art.

Still another embodiment of the present invention is directed to an improved way of mounting a speaker to a tubular body. Presently, speakers have been mounted to a tubular body in one of two ways. The speakers can be mounted from behind, or can be mounted on a baffle for which part of the tubular body was flattened. Mounting the speaker from behind is disadvantageous in mass production and a baffle is unwanted because it may introduce resonances as a flat surface, as well as diffraction and beaming. And even larger disadvantage is that both these ways of mounting loudspeakers to a tube pose practical limits to the maximum ration of speaker diameter to tube diameter. In the present invention, the diameter of the speaker can be virtually the same size as that of the tube. As shown in FIG. 2, for example, a flange 40 is mounted on or formed integrally with the tubular wall portion 15 of speaker housing 10. The speaker 50 is then inserted from the exterior of the speaker housing 10 so that the edges of the speaker 50 contact the flange 40 permitting the speaker 50 to then be affixed in any conventional manner.

These advantages resulting from the various embodiments of the present invention afford an acoustic building block that can be economically produced and easily used as stand-alone units or integrated in products.

Various aspects of the invention are illustrated in further detail in the following examples.

EXAMPLE 1

In order to do comparative testing with an enclosure of a renowned loudspeaker manufacturer, the speakers from a pair of JBL J2045 were taken an mounted in an enclosure according to the present invention. This enclosure consisted of a 14½ inch length of ⅙ inch thin walled PVC drain pipe of 6 inch diameter with a flat top and bottom. The JBL speaker, with a diameter of 5 inches, could not have been mounted to this enclosure using the techniques known in the prior art. Audio testing showed a better bass, complete absence of panel resonances and better stereo imaging, and a minimal diffraction signature. The new speaker was approximately one half the weight of the original speaker.

EXAMPLE 2

To demonstrate the use of very thin materials for the wall of the Helmholtz resonator chamber, enclosures were made of two recyclable plastic soda bottles, both with a volume of approximately 6 fluid ounces. The bottle material is a flexible, approximately 1/24th inch thick, PET thermoplastic. The speakers mounted were small Audax speakers of 2.5 inch diameter capable of large power handling of approximately 30 watts RMS. Even at very high sound levels, panel resonances were virtually absent. These enclosures produced unparalleled bass with a weight of approximately 4 ounces each without speakers.

EXAMPLE 3

A set of hi-wired high end speakers was produced using 5 inch Hafler automotive speakers and 1¼ inch dome tweeters. The tube consisted of thin walled 8 inch PVC pipe, with a top and bottom made out of hemispheres of a very flexible polyethylene. Each enclosure weighed less than 14 pounds with speakers but were capable of handling more than 2×100 watts for the bass and 2×30 watts for the mid/high range. This resulted in distortion free sound at levels well above 100 dB, even in large listening rooms. Because of their shape, stereo imaging was unsurpassed. Bass was well defined and rich. Bass extended to well below 40 Hertz, which is considerably lower than predicted by the prior art.

Having thereby disclosed the subject matter of this invention, it should be obvious that many substitutions, modifications, and variations of the invention are possible in light of the above teachings. It is therefore to be understood that the invention as taught and described is only to be limited to the extent of the breadth and scope of the appended claims.

The foregoing is considered as illustrative only of the principles of the invention. Further, since numerous modifications, and changes will readily occur to those skilled in the art, it is not desired to limit the invention to the exact construction and operation shown and described, and accordingly all suitable modifications and equivalents, falling within the scope of the invention, may be resorted to.

I claim:

1. A Helmholtz resonator speaker comprising:

(a) a speaker assembly;

(b) a speaker enclosure having a generally tubular shape with a hemispherical closure at each end of the tubular speaker enclosure so that the speaker enclosure forms a generally capsule shape;

(c) a first opening in said speaker enclosure, said first opening adapted to receive said speaker assembly so that the axis of the speaker assembly forms a generally right angle to the axis of the speaker enclosure;

(d) a second opening in said speaker enclosure; and (e) a tube member disposed within said speaker housing, said tube member having a first tube end and a second tube end, wherein said first tube end is disposed in said speaker enclosure and said second tube end is connected to said speaker enclosure as said second opening so that when the speaker assembly generates sound waves within said speaker enclosure, the sound waves can enter into said first opening propagate through said conduit, exit said second port, and exit said speaker enclosure.

2. A Helmholtz resonator speaker with an improved bass response and a minimal diffraction signature, said Helmholtz resonator speaker comprising:

(a) a speaker assembly;

(b) a speaker enclosure having a generally tubular shape with a hemispherical closure at each end forming a chamber having a capsule shape, said speaker enclosure having a top hemispherical portion and a bottom hemispherical portion;

(c) a first opening in said speaker enclosure, said first opening adapted to receive said speaker assembly so that the axis of the speaker assembly forms a generally right angle to the axis for the speaker enclosure;

(d) a second opening in the bottom hemispherical portion of the speaker enclosure;

(e) means for spacing the bottom of the speaker enclosure from the surface it is resting on, said spacing means attached to the exterior of the bottom hemispherical portion of the speaker enclosure; and (f) a tube member disposed within said speaker housing, said tube member having a first tube end and a second tube end, wherein said first tube end is disposed in said speaker housing and said second tube end is connected to said housing at said second opening so that when the speaker assembly generates sound waves within said speaker enclosure, the sound waves enter into said first opening, propagate through said conduit and exit said second opening and said second port out of the speaker enclosure.

3. The Helmholtz resonator speaker of claim 2 wherein said spacing means comprises legs.

4. The Helmholtz resonator speaker of claim 2 wherein said spacing means comprises a stand.

5. The Helmholtz resonator speaker of claim 2 further comprising a flange around said first opening in said speaker enclosure and means for mating said speaker assembly to said flange, wherein said speaker assembly is passed through the port so that the edges of said speaker assembly mate with said flange surrounding said first opening.

* * * * *